(12) United States Patent
Fang et al.

(10) Patent No.: US 6,482,289 B1
(45) Date of Patent: Nov. 19, 2002

(54) NONCONDUCTIVE LAMINATE FOR COUPLING SUBSTRATES AND METHOD THEREFOR

(75) Inventors: Treliant Fang, Chandler, AZ (US); Melissa E. Grupen-Shemansky, Phoenix, AZ (US); Shun-Meen Kuo, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 1067 days.

(21) Appl. No.: 08/540,139

(22) Filed: Oct. 6, 1995

(51) Int. Cl.[7] ............................................. B32B 31/00
(52) U.S. Cl. ................... 156/295; 156/315; 156/330; 428/414; 523/455; 525/524
(58) Field of Search .................. 428/414; 523/455; 156/295, 330, 315; 525/524

(56) References Cited

U.S. PATENT DOCUMENTS

| | | | | |
|---|---|---|---|---|
| 3,476,702 A | * | 11/1969 | Yamamoto et al. | 525/524 |
| 4,749,120 A | * | 6/1988 | Hatada | 156/295 |
| 5,232,532 A | * | 8/1993 | Hori | 156/295 |

* cited by examiner

Primary Examiner—John J. Gallagher
(74) Attorney, Agent, or Firm—Miriam Jackson; Robert F. Hightower

(57) ABSTRACT

An assembly and method for connecting two substrates utilizes a nonconductive laminant that is compatible when wet with a conductive paste when wet. Thus, the curing of the nonconductive laminant and the conductive paste may be performed together. The nonconductive laminant also cures in a shorter time than those previously available, thus the stress on the semiconductor device created by exposure to the cure temperature is additionally reduced.

7 Claims, 1 Drawing Sheet

NONCONDUCTIVE LAMINATE FOR COUPLING SUBSTRATES AND METHOD THEREFOR

BACKGROUND OF THE INVENTION

This invention relates, in general, to a nonconductive laminant and its use to couple two substrates, and more particularly, a nonconductive laminate that is compatible with a conductive paste used to couple two substrates.

In the semiconductor processing area, flip-chip packaging uses a conductive bump or post formed on a semiconductor device to be electrically coupled to another conductive bump or pad of a substrate. This is in contrast to a wire bonded device where the device is mounted on to a substrate and wires are used to electrically couple the semiconductor device with a substrate. Flip-chip electronic products are faster, smaller, and sometimes more reliable than wire bonded electronic products.

The flip chip semiconductor device must be encapsulated to protect it from moisture and contamination, as well as improving the structural integrity of the finished device. One method of encapsulation includes depositing an underfill material between the semiconductor device and the substrate after the semiconductor device and the substrate have been coupled. Underfill processes have disadvantages because the underfill material must be of the right viscosity to completely fill the underside of the chip.

Another method of encapsulation used in the past is a glob top or overmold process, which entails dispensing a glob of material over the flip or wire bonded chip after the semiconductor device and the substrate have been coupled. In flip chip applications, the glob top material is often used in conjunction with an underfill material.

An additional disadvantage of the above encapsulating processes is that the underfill material or glob top material must be cured after encapsulation. This curing step can be a time consuming process which can introduce unnecessary stress to the semiconductor device due to the exposure to high temperatures. Another disadvantage of the above encapsulating processes is that a gap between the semiconductor device and the substrate must be large enough for the material to fill the gap by capillary action. A large gap is undesirable because it increases the thickness of the finished electronic product.

Accordingly, a need exists for developing an improved method and/or material for coupling two substrates, which does not stress the device as much and can be fabricated in a shorter cycle time, thus reducing cost and producing more robust products. It would also be desirable to reduce the size of the gap between the semiconductor device and the substrate in order to manufacture thin electronic products that may be used in smart card applications.

DETAILED DESCRIPTION OF THE DRAWINGS

An assembly and method for connecting two substrates will be described. The assembly utilizes a nonconductive laminate that is compatible when wet as defined by a fluid, uncured state with a conductive paste when wet.

Thus, the curing of the nonconductive laminate and the conductive paste may be performed together. The cycle time of processing the semiconductor device is additionally reduced.

A related and allowed patent application, filed as Ser. No. 08/411,355 by Scroeder et al, now U.S. Pat. No. 5,742,100 assigned to the same assignee as this application, is hereby incorporated by reference. The instant invention relates to a nonconductive laminate for use with the invention disclosed in patent application Ser. No. 08/411,355 and improves and simplifies the process of that prior invention.

Figure 1:
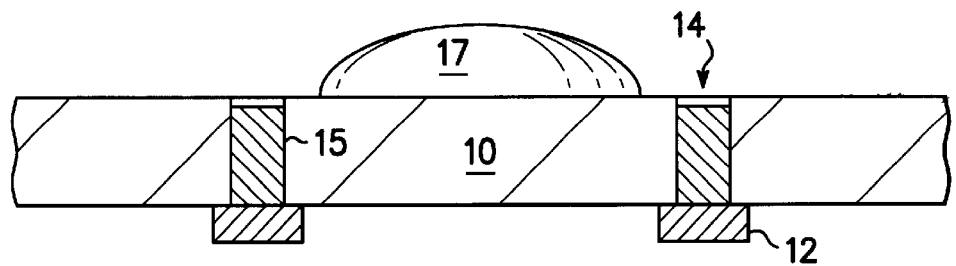
FIG. 1 illustrates a first embodiment of a method of the present invention in a first stage of fabrication.

FIG. 1 illustrates a first embodiment of the present invention. A first substrate 10 is provided. First substrate 10 is preferably a flexible substrate with metallization formed on one or both sides. A flexible substrate is typically comprised of an insulating material comprising epoxy glass cloth or polyimide. Alternatively, first substrate 10 may be any type of substrate, such as a semiconductor device or printed circuit board, where electrical coupling to another substrate is desirable.

A conductive element 12 is disposed on one side of first substrate 10. Conductive element 12 is used to electrically interface the flip chip product when completed to another media, for example a smart card reader or other device for biasing and data transfer. Conductive element 12 is preferably comprised of a metal system, such as copper/nickel/gold. The formation of conductive element 12 is well known in the art. A via 14 is disposed on first substrate 10 so that via 14 exposes at least a portion of conductive element 12. The formation of via 14 is also well known in the art.

Next, a conductive paste 15 is disposed in via 14. Conductive paste 15 is preferably comprised of an epoxy or cyanate ester based matrix resin, along with a conductive filler material. An example of a suitable conductive paste is called H20E, which is commercially available from Epoxy Technology. The filler material in H20E is silver. In a preferred embodiment, conductive paste 15 is dispensed, however, other methods of application may be used. Preferably, conductive paste 15 is left at least partially uncured or wet. Most preferably, conductive paste 15 is not exposed to any cure cycle where conductive paste 15 must be exposed to a temperature greater than room temperature for curing.

A nonconductive laminate 17 is then disposed on a portion of one side of first substrate 10. Typically, nonconductive laminate 17 is disposed on a central portion of first substrate 10, as shown in FIG. 1. It is preferable that nonconductive laminate 17 not make physical contact with conductive paste 15 at this step. Nonconductive laminate 17 may be applied by screen printing, dispensing, or other suitable means.

Nonconductive laminate 17 is compatible with conductive paste 15 when conductive paste 15 and nonconductive laminate 17 are both at least partially or fully uncured. That nonconductive laminate 17 be compatible with conductive paste 15 means that they do not interact chemically to produce undesirable results, such as conductivity loss or unreliable encapsulation.

One key to compatibility is that both nonconductive laminate 17 and conductive paste 15 are bases or both are acids. In the past, an encapsulant underfill or glob top material and a conductive paste have been incompatible; the conductive paste being a base and the encapsulant being an acid. Thus, it was necessary to cure the conductive paste prior to the encapsulant being disposed between the substrates or a degradation in conductivity and/or a degradation is the encapsulation process would result.

Figure 2:
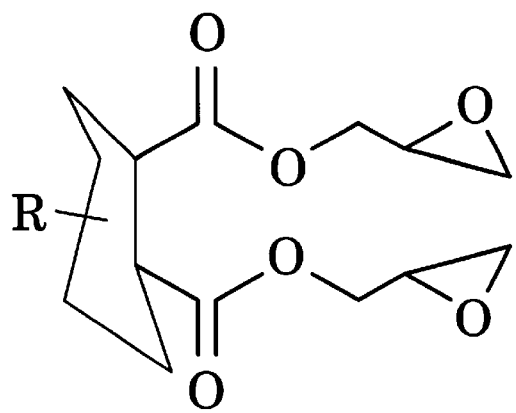
FIG. 2 illustrates a general structural formula which makes up a part of the nonconductive laminate of the present invention.

Nonconductive laminate 17 is comprised of an epoxy, a toughener comprised of a cyclohexanedicarboxylate, and a curing agent. A preferred embodiment of the toughener is illustrated in FIG. 2. Shown is a 1,2-cyclohexanedicarboxylate diglycidyl ether, where R is hydrogen (H) or alkyl group(s), $C_nH_{2n+1}$, where n=1 to 30. This toughener also acts as a thermally activated diluent. In one embodiment, the nonconductive laminate is comprised of a toughener that is compatible with the conductive paste. The epoxy is preferably comprised of bisphenol F or Novolak diglycidyl ether (epoxy). The curing agent is preferably comprised of a cyano-alkylated imidazole, such as Curimid CN®, which is a thermally activated latent curing agent and is commercially available from Polyorganix, Inc. Preferably, nonconductive laminate 17 is comprised of 10–95% by weight of a Novolak epoxy, 10–95% by weight of the toughener, and 1–20% by weight of the curing agent. Most preferably, nonconductive laminate 17 is comprised of approximately, by weight, 74.4% of the epoxy, 19.1% of the toughener, and 6.5% of the curing agent.

Nonconductive laminate 17 of the present invention has good cohesive properties, due to the addition of the toughener. The underfill materials of the prior art are not comprised of a toughener, and thus do not have desirable mechanical properties. It is important that nonconductive laminate 17 have adhesive properties in the present invention because the gap between first substrate 10 and second substrate 20 is small. The adhesive properties enable nonconductive laminate 17 to withstand thermal shock without delamination of nonconductive laminate 17 and first substrate 10 or second substrate 20 (see FIG. 3). Nonconductive laminate 17 of the present invention does have good thermal shock reliability (greater than 500 cycles at −55 to 125° C.). Additionally, nonconductive laminate 17 has a long pot life (greater than 20 hours at room temperature) and a short curing time.

Figure 3:
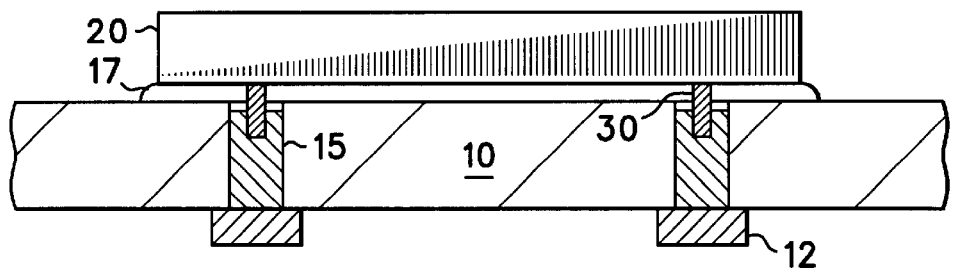
FIG. 3 illustrates a first embodiment of a method of the present invention in a succeeding stage of fabrication.

FIG. 3 illustrates the first embodiment of the present invention in a later stage of fabrication. A second substrate 20, illustrated as a semiconductor device in this embodiment, is flip chip bonded to first substrate 10. Second substrate 20 may be comprised of, for example, an active or passive discrete device such as a transistor, diode, or resistor, capacitor, etc., or an integrated circuit. In addition, modules may be fabricated with multiple second substrates 20 coupled to a single first substrate 10. Alternatively, second substrate 20 may be any type of substrate where electrical coupling to another substrate is desirable.

A conductive bump 30 is disposed on one side of second substrate 20. Two conductive bumps 30 are shown in this embodiment, however, one or more conductive bumps 30 may be disposed on second substrate 20. Conductive bump 30 may be comprised of, for example, a conductive polymer, a wire bond ball bump, or an electroplated bump. Conductive bump 30 is electrically coupled to the semiconductor device fabricated on second substrate 20. The formation of second substrate 20 with conductive bump 30 is well known in the art.

Second substrate 20 is then positioned above first substrate 10, with conductive bump 30 of second substrate 20 over via 14, and placed so that conductive bump 30 is in via 14. Pressure and/or heat may be applied to first substrate 10 or second substrate 20 so that nonconductive laminate 17 is spread out or extruded to fill the gap between first substrate 10 and second substrate 20. A portion of nonconductive laminate 17 may be extruded into via 14, as shown in FIG. 3. Alternatively, via 14 may be completely filled by conductive paste 15.

After second substrate 20 is coupled to first substrate 10, nonconductive laminate 17 and conductive paste 15 are cured. The curing process is preferably performed at a temperature range of approximately 100–180° C. for approximately 1–60 minutes. Other times and temperatures may be used, and suitable times and temperatures may vary according to the size of the gap between first substrate 10 and second substrate 20 and the size of second substrate 20 and the amount of the curing agent.

Both conductive paste 15 and nonconductive laminate 17 may be snap cured at the same time. Because curing of conductive paste 15 and nonconductive laminate 17 may be performed at the same time, cycle time and exposure of second substrate 20 to high temperatures are reduced. In addition, because nonconductive laminate 17 is extruded to fill the gap between first substrate 10 and second substrate 20, the gap may be made smaller than with the use of an underfill process. The gap must be larger when using an underfill process to ensure that capillary action takes place to completely fill the gap. In the present invention, less cure time is necessary because there is less volume of nonconductive laminate 17 and a smaller gap translates to a thinner finished good suitable for smart card applications.

Figure 4:
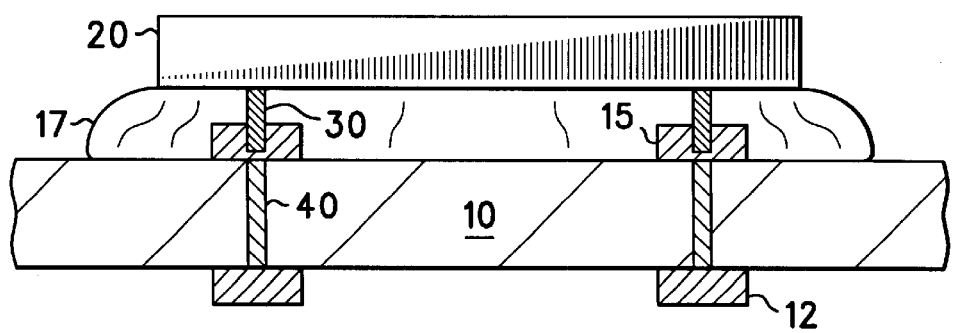
FIG. 4 illustrates a second embodiment of a method of the present invention.

FIG. 4 illustrates a second embodiment of the present invention. The same numerals will be used to represent the same or similar elements as shown in FIG. 3. In this embodiment, a via 14 is not formed in first substrate 10. Here, conductive paste 15 is disposed on first substrate 10. Electrical coupling is made from conductive paste 15 to conductive element 12 by metal traces 40 formed in first substrate 10. The formation of first substrate 10, as shown in this embodiment, is well known in the art. Coupling of first substrate 10 and second substrate 20 is performed as described above, with reference to FIGS. 1 and 3. The lamination process of the present invention is possible with or without bond pad dams (not shown) to direct the flow of conductive laminate 17. The embodiment shown in FIG. 3 is preferred because the embodiment of FIG. 4 will probably have a wider gap between first substrate 10 and second substrate 20. In the embodiment illustrated in FIG. 4, a longer cure time is probably necessary, depending on the height of conductive bump 30.

In both of the embodiments illustrated in FIG. 3 and FIG. 4, it is important that nonconductive laminate 17 when wet be compatible with conductive paste 15 when wet to prevent degradation of conductivity of conductive paste 15 or to prevent degradation in the reliability of the encapsulation.

As can be seen, the use of a nonconductive laminate 17 which is compatible with conductive paste 15 when both are wet allows for a single step curing of two coupled substrates. The single step curing reduces processing cycle time and reduces the stress imposed on the substrates due to elimination of multiple exposures to cure temperatures as compared to the prior art where the curing is performed in two or more steps.

What is claimed is:

1. A method of coupling substrates, comprising the steps of:

providing a first substrate having a conductive element formed on a portion of the first substrate;

providing a second substrate having a conductive bump formed thereon;

disposing a conductive paste on at least a portion of the conductive element, wherein the conductive paste is at least partially uncured;

disposing a nonconductive laminate on a portion of the first substrate, wherein the nonconductive laminate is comprised of an epoxy, a curing agent and a toughener comprised of a cyclohexanedicarboxylate and is at least partially uncured;

coupling the second substrate and the first substrate so that the conductive pump is electrically coupled to the conductive element and the second substrate is physically coupled to the nonconductive laminate; and curing the conductive paste and the nonconductive laminate after the step of coupling the second substrate and the first substrate.

2. The method of claim 1 wherein the step of disposing the nonconductive laminate further comprises forming the nonconductive laminate to be comprised of a material which does not interact with the conductive paste when the nonconductive laminate and the conductive paste are at least partially uncured.

3. The method of claim 1 wherein the step of disposing the nonconductive laminate further comprises forming the nonconductive laminate to be comprised of a base if the conductive paste is comprised of a base or to be comprised of an acid if the conductive paste is comprised of an acid.

4. A method of coupling substrates, comprising the steps of:

providing a first substrate having a conductive element formed a portion of the first substrate;

providing a second substrate having a conductive bump formed thereon;

disposing a conductive paste on at least a portion of the conductive element, wherein the conductive paste is at least partially uncured;

disposing a nonconductive laminate on a portion of the first substrate, wherein the nonconductive laminate is comprised of a base if the conductive paste is comprised of a base or is comprised of an acid if the conductive paste is comprised of an acid and is at least partially uncured;

coupling the second substrate and the first substrate so that the conductive bump is electrically coupled to the conductive element and the second substrate is physically coupled to the nonconductive laminate; and curing the conductive paste and the nonconductive laminate after the step of coupling the second substrate and the first substrate.

5. The method of claim 4 wherein the step of disposing the conductive paste further comprises forming the conductive paste to be wet and wherein the step of disposing the nonconductive laminate further comprises forming the nonconductive laminate to be wet.

6. The method of claim 4 wherein the step of disposing the nonconductive laminate further comprises forming the nonconductive laminate to be comprised of an epoxy, a toughener comprised of a cyclohexanedicarboxylate, and a curing agent.

7. The method of claim 6 wherein the step of disposing the nonconductive laminate further comprises using as the toughener one that is comprised of 10–95% by weight of:

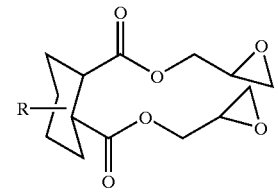

where R is H, a or $C_nH_{2n+1}$, and where n=1–30.